United States Patent
Takao et al.

(10) Patent No.: US 12,484,342 B2
(45) Date of Patent: Nov. 25, 2025

(54) NITRIDE SEMICONDUCTOR LIGHT-EMITTING ELEMENT AND METHOD FOR MANUFACTURING NITRIDE SEMICONDUCTOR LIGHT-EMITTING ELEMENT

(71) Applicant: NIKKISO CO., LTD., Tokyo (JP)

(72) Inventors: Kazufumi Takao, Ishikawa (JP); Yusuke Matsukura, Ishikawa (JP)

(73) Assignee: Nikkiso Co., Ltd., Tokyo (JP)

( * ) Notice: Subject to any disclaimer, the term of this patent is extended or adjusted under 35 U.S.C. 154(b) by 605 days.

(21) Appl. No.: 17/523,011

(22) Filed: Nov. 10, 2021

(65) Prior Publication Data

US 2022/0165915 A1    May 26, 2022

(30) Foreign Application Priority Data

Nov. 20, 2020   (JP) .................. 2020-193593

(51) Int. Cl.
*H10H 20/817*   (2025.01)
*H10H 20/01*    (2025.01)
*H10H 20/812*   (2025.01)
*H10H 20/815*   (2025.01)
*H10H 20/825*   (2025.01)

(52) U.S. Cl.
CPC .... *H10H 20/817* (2025.01); *H10H 20/01335* (2025.01); *H10H 20/0137* (2025.01); *H10H 20/815* (2025.01); *H10H 20/812* (2025.01); *H10H 20/825* (2025.01)

(58) Field of Classification Search
CPC ... H01L 33/16; H01L 33/007; H01L 33/0075; H01L 33/12; H01L 33/06; H01L 33/32; H01L 33/14
See application file for complete search history.

(56) References Cited

U.S. PATENT DOCUMENTS

| | | | |
|---|---|---|---|
| 2011/0163349 A1* | 7/2011 | Sakai | .................. H01L 21/0262 438/46 |
| 2012/0074385 A1* | 3/2012 | Tak | .................. H01L 21/02642 257/190 |

(Continued)

FOREIGN PATENT DOCUMENTS

| | | | | |
|---|---|---|---|---|
| EP | 2747220 A1 * | 6/2014 | ......... | H01L 33/0008 |
| JP | 2014-093369 A | 5/2014 | | |

(Continued)

OTHER PUBLICATIONS

Japanese Official Action dated Oct. 18, 2022 from related JP 2020-193593 together with English language translation.

(Continued)

*Primary Examiner* — Teresa M. Arroyo
(74) *Attorney, Agent, or Firm* — Scully, Scott, Murphy & Presser, PC

(57) ABSTRACT

A nitride semiconductor light-emitting element includes a substrate, a buffer layer formed on the substrate, an n-type semiconductor layer formed on the buffer layer, and an active layer being formed on the n-type semiconductor layer and comprising a single quantum well structure. A full width at half maximum of an X-ray rocking curve for a (102) plane of the buffer layer is not less than 369.4 arcsec and not more than 492.5 arcsec.

6 Claims, 10 Drawing Sheets

(56) References Cited

U.S. PATENT DOCUMENTS

| | | | |
|---|---|---|---|
| 2015/0171263 A1* | 6/2015 | Nakatsu | H01L 33/007 |
| | | | 438/47 |
| 2017/0141269 A1 | 5/2017 | Konno et al. | |
| 2017/0250308 A1* | 8/2017 | Jo | C30B 29/403 |
| 2017/0345642 A1* | 11/2017 | Jorgenson | H01L 21/02576 |
| 2019/0288167 A1* | 9/2019 | Inoue | H01L 33/56 |
| 2020/0032418 A1* | 1/2020 | Goto | H01L 21/02658 |
| 2021/0005778 A1* | 1/2021 | Huang | H01L 33/12 |
| 2021/0066546 A1* | 3/2021 | Wada | H01L 33/0075 |
| 2021/0296527 A1 | 9/2021 | Matsukura et al. | |

FOREIGN PATENT DOCUMENTS

| | | |
|---|---|---|
| JP | 2019-121655 A | 7/2019 |
| JP | 2020-21798 A | 2/2020 |
| KR | 1020160149837 A * | 12/2016 ............. H01L 33/06 |

OTHER PUBLICATIONS

Japanese Official Action dated Jul. 12, 2022 from related JP 2020-193593 together with English language translation.
Taiwanese Official Action and Search Report mailed on Nov. 16, 2022 from related TW 110141470 together with English language translation.
English abstract of JP 2019-121655A.

* cited by examiner

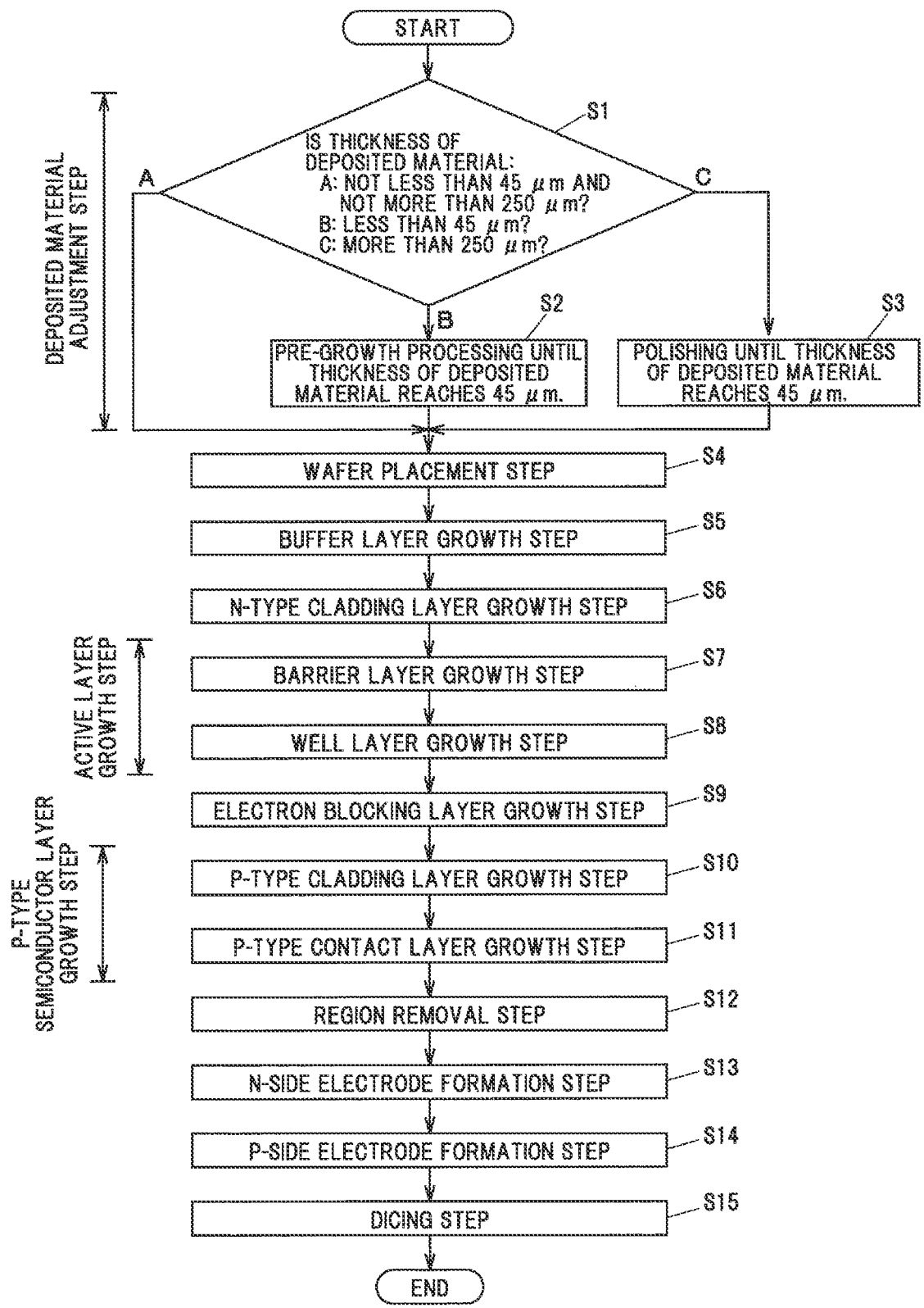

FIG. 4

| | THICKNESS OF DEPOSITED MATERIAL ON SUSCEPTOR (μm) | THICKNESS OF BUFFER LAYER (μm) | FULL WIDTH AT HALF MAXIMUM FOR (102) PLANE OF BUFFER LAYER (arcsec) | FULL WIDTH AT HALF MAXIMUM FOR (102) PLANE OF N-TYPE CLADDING LAYER (arcsec) | EMISSION WAVELENGTH (nm) | LIGHT OUTPUT (a.u.) |
|---|---|---|---|---|---|---|
| FIRST EXAMPLE | 182 | 2.0 | 410.8 | 528.1 | 317.578 | 0.950 |
| SECOND EXAMPLE | 53 | 2.0 | 375.2 | 556.7 | 315.196 | 0.944 |
| THIRD EXAMPLE | 66 | 2.0 | 378.2 | 605.4 | 313.607 | 1.009 |
| FOURTH EXAMPLE | 80 | 2.0 | 369.4 | 662.1 | 318.372 | 1.007 |
| FIFTH EXAMPLE | 186 | 2.0 | 420.4 | 501.9 | 321.548 | 1.004 |
| SIXTH EXAMPLE | 194 | 2.0 | 430.0 | 487.2 | 319.96 | 1.021 |
| SEVENTH EXAMPLE | 100 | 1.5 | 463.5 | 481.1 | 315 | 1.045 |
| EIGHTH EXAMPLE | 116 | 1.5 | 486.0 | 491.4 | 315 | 1.035 |
| NINTH EXAMPLE | 124 | 1.5 | 492.5 | 503.7 | 314.401 | 1.032 |
| FIRST COMPARATIVE EXAMPLE | 16 | 2.0 | 354.5 | 758.9 | 315.99 | 0.823 |
| SECOND COMPARATIVE EXAMPLE | 8 | 2.0 | 356.1 | 782.8 | 306.454 | 0.661 |

NITRIDE SEMICONDUCTOR LIGHT-EMITTING ELEMENT AND METHOD FOR MANUFACTURING NITRIDE SEMICONDUCTOR LIGHT-EMITTING ELEMENT

CROSS-REFERENCE TO RELATED APPLICATION

The present application is based on Japanese Patent Application No. 2020-193593 filed on Nov. 20, 2020, the entire contents of which are incorporated herein by reference.

BACKGROUND OF THE INVENTION

1. Field of the Invention

The invention relates to a nitride semiconductor light-emitting element and a method for manufacturing a nitride semiconductor light-emitting element.

2. Related Art

In recent years, nitride semiconductor light-emitting elements such as light-emitting diodes or laser diodes which emit ultraviolet light have been available, and nitride semiconductor light-emitting elements with improved luminous efficiency have been under development (see JP 2020/21798 A).

The nitride semiconductor light-emitting element described in JP 2020/21798 A includes a sapphire substrate, a buffer layer formed on the sapphire substrate, an n-type semiconductor layer (an n-type cladding layer) formed on the buffer layer, an active layer that is formed on the n-type semiconductor layer and includes a single quantum well structure composed of one barrier layer and one well layer, an electron blocking layer formed on the active layer, a p-type semiconductor layer (a p-type cladding layer and a p-type contact layer) formed on the electron blocking layer, a p-side electrode formed on the p-type semiconductor layer, and an n-side electrode formed on a certain region of the n-type semiconductor layer.

In JP 2020/21798 A, luminous efficiency of the nitride semiconductor light-emitting element which emits ultraviolet light at a central wavelength of 290 nm to 360 nm can be improved by providing the single quantum well structure composed of one barrier layer and one well layer between the n-type semiconductor layer and the electron blocking layer. The luminous efficiency of this nitride semiconductor light-emitting element is improved by also adjusting the thickness or the Al composition ratio of the n-type semiconductor layer to fall within an appropriate range.

However, luminous efficiency required for nitride semiconductor light-emitting elements in recent years has become higher, and the nitride semiconductor light-emitting element disclosed in JP 2020/21798 A cannot sufficiently meet the market demand in some cases.

THE SUMMARY OF THE INVENTION

Therefore, it is an object of the invention to provide a nitride semiconductor light-emitting element which uses a single quantum well structure and can have improved luminous efficiency, and a method for manufacturing such a nitride semiconductor light-emitting element.

To achieve the object described above, the invention provides a nitride semiconductor light-emitting element, comprising:
a substrate;
a buffer layer formed on the substrate;
an n-type semiconductor layer formed on the buffer layer; and
an active layer being formed on the n-type semiconductor layer and comprising a single quantum well structure,
wherein a full width at half maximum of an X-ray rocking curve for a (102) plane of the buffer layer is not less than 369.4 arcsec and not more than 492.5 arcsec.

To achieve the object described above, the invention also provides a method for manufacturing a nitride semiconductor light-emitting element, comprising:
a buffer layer growth step to grow a buffer layer on a substrate;
an n-type semiconductor layer growth step to grow an n-type semiconductor layer on the buffer layer; and
an active layer growth step to grow an active layer comprising a single quantum well structure on the n-type semiconductor layer,
wherein in the buffer layer growth step, the buffer layer is grown so that a full width at half maximum of an X-ray rocking curve for a (102) plane of the buffer layer is not less than 369.4 arcsec and not more than 492.5 arcsec.

Effects of the Invention

According to the present invention, it is possible to provide a nitride semiconductor light-emitting element which uses a single quantum well structure and can have improved luminous efficiency, and a method for manufacturing such a nitride semiconductor light-emitting element.

BRIEF DESCRIPTION OF THE DRAWINGS

Next, the present invention will be explained in more detail in conjunction with appended drawings, wherein:

FIG. 3 is a flowchart showing a process of manufacturing the nitride semiconductor light-emitting element;

FIG. 4 is a table showing results of measuring light output in Examples and Comparative Examples;

DESCRIPTION OF THE PREFERRED EMBODIMENTS

Embodiment

An embodiment of the invention will be described in reference to the drawings. The embodiment below is described as a preferred example for implementing the invention. Although some part of the embodiment specifically illustrates various technically preferable matters, the technical scope of the invention is not limited to such specific aspects. In addition, a scale ratio of each constituent element in each drawing is not necessarily the same as the actual scale ratio of the nitride semiconductor light-emitting element.

(Configuration of Nitride Semiconductor Light-Emitting Element)

Figure 1:
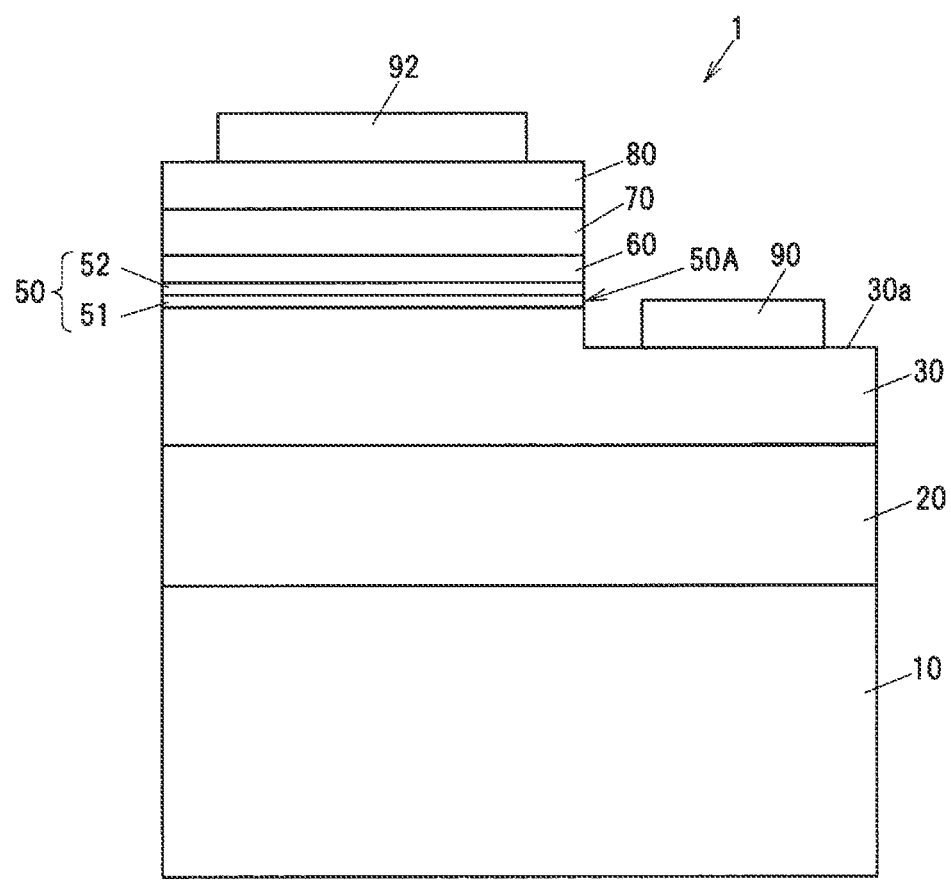
FIG. 1 is a schematic cross-sectional view showing an example configuration of a light-emitting element in an embodiment of the present invention.

FIG. 1 is a schematic cross-sectional view showing an example configuration of a nitride semiconductor light-emitting element 1 in an embodiment of the invention. The nitride semiconductor light-emitting element 1 (hereinafter, also simply referred to as "light-emitting element 1") includes, e.g., laser diode or light-emitting diode (LED). In the present embodiment, a light-emitting diode (LED) which emits ultraviolet light at a central wavelength of 290 nm to 365 nm (preferably, 300 nm to 330 nm) will be described as an example of the light-emitting element 1.

As shown in FIG. 1, the light-emitting element 1 includes a substrate 10, a buffer layer 20 formed on the substrate 10, an n-type cladding layer 30 formed on the buffer layer 20, an active layer 50 that is formed on the n-type cladding layer 30 and has a single quantum well structure 50A, an electron blocking layer 60 formed on the active layer 50, a p-type cladding layer 70 formed on the electron blocking layer 60, a p-type contact layer 80 formed on the p-type cladding layer 70, an n-side electrode 90 formed on a certain region of the n-type cladding layer 30, and a p-side electrode 92 formed on the p-type contact layer 80. That is, the light-emitting element 1 is configured as a single quantum well light-emitting diode in which the active layer 50 having the single quantum well structure 50A is sandwiched between the n-type semiconductor layer composed of the n-type cladding layer 30 and the p-type semiconductor layer composed of the p-type cladding layer 70 and the p-type contact layer 80. It also can be described that the n-type cladding layer 30 is formed on the substrate 10 via the buffer layer 20, the p-type cladding layer 70 is formed on the active layer 50 via the electron blocking layer 60, and the p-type contact layer 80 is formed on the active layer 50 via the electron blocking layer 60 and the p-type cladding layer 70.

As the semiconductor constituting the light-emitting element 1, it is possible to use, e.g., a binary or ternary group III nitride semiconductor which is expressed by $Al_xGa_{1-x}N$ ($0 \leq x \leq 1$). In addition, nitrogen (N) may be partially substituted with phosphorus (P), arsenic (As), antimony (Sb) or bismuth (Bi), etc.

The substrate 10 is a sapphire substrate including a sapphire ($Al_2O_3$) single crystal. Alternatively, e.g., an aluminum nitride (AlN) substrate or an aluminum gallium nitride (AlGaN) substrate may be used as the substrate 10 instead of the sapphire substrate. A c-plane of the substrate 10 may have an off angle.

The buffer layer 20 is made of aluminum nitride. The buffer layer 20 may be made of aluminum gallium nitride when the substrate 10 is an aluminum gallium nitride substrate. In more detail, the buffer layer 20 is preferably made of aluminum nitride when the substrate 10 is a sapphire substrate or an aluminum nitride substrate, and the buffer layer 20 is preferably made of aluminum gallium nitride having an Al composition ratio within about ±5% of the Al composition ratio of the substrate 10 when the substrate 10 is aluminum gallium nitride.

A full width at half maximum (FWHM) of an X-ray rocking curve for a (102) plane of the buffer layer 20 is not less than 369.4 arcsec and not more than 492.5 arcsec, preferably not less than 378.2 arcsec and not more than 492.5 arcsec, and more preferably not less than 420.4 arcsec and not more than 492.5 arcsec. The "full width at half maximum of the X-ray rocking curve for the (102) plane" here is a FWHM of measured values obtained from X-ray rocking curve measurement on the (102) plane and is a numerical value to be an indicator of crystal quality. Hereinafter, the "full width at half maximum of the X-ray rocking curve for the (102) plane" is referred to as the "FWHM for the (102) plane".

In this regard, when the substrate 10 is an aluminum nitride substrate or an aluminum gallium nitride substrate, the FWHM for the (102) plane of a combination of the buffer layer 20 and the substrate 10 is defined as the FWHM for the (102) plane of the buffer layer 20 since it is difficult to distinguish between the buffer layer 20 and the substrate 10 in the X-ray rocking curve measurement. In other words, when the substrate 10 is an aluminum nitride substrate or an aluminum gallium nitride substrate, the FWHM for the (102) plane of a underlayer structure composed of the buffer layer 20 and the substrate 10 is not less than 369.4 arcsec and not more than 492.5 arcsec, preferably not less than 378.2 arcsec and not more than 492.5 arcsec, and more preferably not less than 420.4 arcsec and not more than 492.5 arcsec.

In addition, the buffer layer 20 has a thickness of not less than 0.01 μm and not more than 2.5 μm, preferably a thickness of not less than 1.4 μm and not more than 2.1 μm, more preferably a thickness of not less than 1.4 μm and not more than 1.6 μm.

In addition, as will be described in detail later, to form the buffer layer 20 in the present embodiment, the buffer layer 20 is grown in a state in which a thickness T of a deposited material D on a susceptor 103 is adjusted to not less than 45 μm and not more than 250 μm. As a result, the FWHM for the (102) plane of the buffer layer 20 can fall within the above-mentioned predetermined range and it is thereby possible to improve the luminous efficiency of the light-emitting element 1.

The n-type cladding layer 30 is an $Al_qGa_{1-q}N$ layer ($0<q\leq1$) doped with silicon (Si) as an n-type impurity and is made of AlGaN with n-type conductivity (hereinafter, also simply referred to as "n-type AlGaN") in present embodiment. A dopant concentration (an Si concentration) in the n-type cladding layer 30 is not less than $0.5 \times 10^{19}$ [atoms/cm$^3$] and not more than $2.5 \times 10^{19}$ [atoms/cm$^3$]. Alternatively, germanium (Ge), selenium (Se) or tellurium (Te), etc., may be used as the n-type impurity.

An Al composition ratio (also called "Al content" or "Al mole fraction") of n-type AlGaN constituting the n-type cladding layer 30 is preferably not more than 50% ($0 \leq q \leq 0.5$), is higher than the Al composition ratio of a well layer 52 (q>s), and is preferably not less than 25% and not more than 50% (0.25≤q≤0.5). The Al composition ratio of AlGaN constituting the n-type cladding layer 30 is preferably as small as possible in a range larger than the Al composition ratio of the well layer 52. In addition, the n-type cladding layer 30 has a thickness of not less than 1 μm and not more than 4 μm, preferably a thickness of not less than 2.5 μm and not more than 3.5 μm, and more preferably a thickness of 3 μm. The n-type cladding layer 30 may have a single layer structure or may have a multilayer structure.

Furthermore, the FWHM for the (102) plane of the n-type cladding layer 30 is not more than 662.1 arcsec, preferably not more than 528.1 arcsec.

The n-type semiconductor layer in the present embodiment is composed of only the n-type cladding layer 30, but the n-type semiconductor layer may be composed of the n-type cladding layer 30 and an n-type contact layer.

Optionally, an undoped AlGaN layer may be formed between the buffer layer 20 and the n-type cladding layer 30. In this case, the Al composition ratio of AlGaN constituting such an AlGaN layer is in a range between the Al composition ratio of the buffer layer 20 and the Al composition ratio of the n-type cladding layer 30. Preferably, the Al composition ratio of such an AlGaN layer is the same as the Al composition ratio of the n-type cladding layer 30.

The active layer 50 includes the single quantum well structure 50A composed of one barrier layer 51 located on the n-type cladding layer 30-side and one well layer 52 located on the electron blocking layer 60-side (i.e., on the opposite side to the n-type cladding layer 30 in the thickness direction). In addition, the active layer 50 is configured to have a band gap of not less than 3.4 eV so that ultraviolet light at a wavelength of not more than 365 nm (preferably, not more than 355 nm) is output.

The barrier layer 51 is an undoped $Al_rGa_{1-r}N$ layer (0<r≤1). The Al composition ratio of AlGaN constituting the barrier layer 51 is not more than 90% (0≤r≤0.9), is higher than the Al composition ratio of the well layer 52 (r>s), and is preferably not less than 50% and not more than 80% (0.5≤r≤0.8). In addition, the barrier layer 51 has a thickness of not less than 3 nm and not more than 50 nm, preferably a thickness of not less than 10 nm and not more than 20 nm. The barrier layer 51 serves to improve luminous efficiency of the well layer 52 by confining electrons and holes in the well layer 52. The barrier layer 51 may alternatively be a layer containing an n-type impurity or a p-type impurity.

The well layer 52 is an undoped $Al_sGa_{1-s}N$ layer (0≤s<1). The Al composition ratio of AlGaN constituting the well layer 52 is not more than 45% (0≤s≤0.45). In addition, the well layer 52 has a thickness of not less than 2 nm and not more than 10 nm, preferably a thickness of not less than 3 nm and not more than 6 nm.

The arrangement of the barrier layer 51 and the well layer 52 in the single quantum well structure 50A is not limited to that described above, and the arrangement order may be reversed from that described above. That is, the configuration may be such that the barrier layer 51 is located on the electron blocking layer 60-side and the well layer 52 is located on the n-type cladding layer 30-side.

The electron blocking layer 60 is a layer made of AlGaN with p-type conductivity (hereinafter, also simply referred to as "p-type AlGaN") and is composed of a first electron blocking layer with the Al composition ratio of 100% and a second electron blocking layer with the Al composition ratio of not less than 57% and not more than 67%. The electron blocking layer 60 serves to improve luminous efficiency of the active layer 50 by suppressing the flow of electrons into the p-type cladding layer 70. The electron blocking layer 60 is not necessarily limited to a p-type semiconductor layer and may be an undoped semiconductor layer. Alternatively, the configuration may be such that the electron blocking layer 60 is omitted and the p-type cladding layer 70 is directly formed on the active layer 50.

The p-type cladding layer 70 is an $Al_tGa_{1-t}N$ layer (0≤t≤1) doped with magnesium (Mg) as a p-type impurity and is made of p-type AlGaN in the present embodiment. Zinc (Zn), beryllium (Be), calcium (Ca), strontium (Sr), barium (Ba) or carbon (C), etc., may be alternatively used as the p-type impurity. In addition, the Al composition ratio of AlGaN constituting the p-type cladding layer 70 is not more than 70% (0≤t≤0.7), preferably in a range within ±10% of the Al composition ratio of n-type AlGaN constituting the n-type cladding layer 30 (q−0.1≤t≤q+0.1), and more preferably the same as the Al composition ratio of n-type AlGaN constituting the n-type cladding layer 30 (t=q). In addition, the p-type cladding layer 70 has a thickness of not less than 10 nm and not more than 1,000 nm, preferably a thickness of not less than 20 nm and not more than 150 nm.

The p-type contact layer 80 is a p-type $Al_uGa_{1-u}N$ layer (0≤u≤1) doped with a high concentration of impurity such as Mg and is made of p-type AlGaN in the present embodiment. A dopant concentration (an Mg concentration) in the p-type contact layer 80 is not less than $5 \times 10^{18}$ [atoms/cm$^3$] and not more than $5 \times 10^{21}$ [atoms/cm$^3$]. The Al composition ratio of AlGaN constituting the p-type contact layer 80 is not more than 10% (0≤u≤0.1), preferably 0% (u=0). In addition, the p-type contact layer 80 has a thickness of not less than 5 nm and not more than 1,000 nm.

The p-type semiconductor layer in the present embodiment is composed of the p-type contact layer 80 and the p-type cladding layer 70, but the p-type semiconductor layer may be composed of only the p-type contact layer 80.

The n-side electrode 90 is made of a multilayered film formed by sequentially stacking titanium (Ti), aluminum (Al), titanium and gold (Au) on the n-type cladding layer 30.

The p-side electrode 92 is made of a multilayered film formed by sequentially stacking nickel (Ni) and gold on the p-type contact layer 80.

(Apparatus for Manufacturing Light-Emitting Element)

Here, a manufacturing apparatus 101 for the light-emitting element 1 which is used to manufacture the light-emitting element 1 will be described in reference to FIG. 2. The manufacturing apparatus 101 is a vertical metal organic chemical vapor deposition apparatus (MOCVD apparatus) and is to manufacture the light-emitting element 1 by growing AlGaN-based nitride semiconductors.

Figure 2:
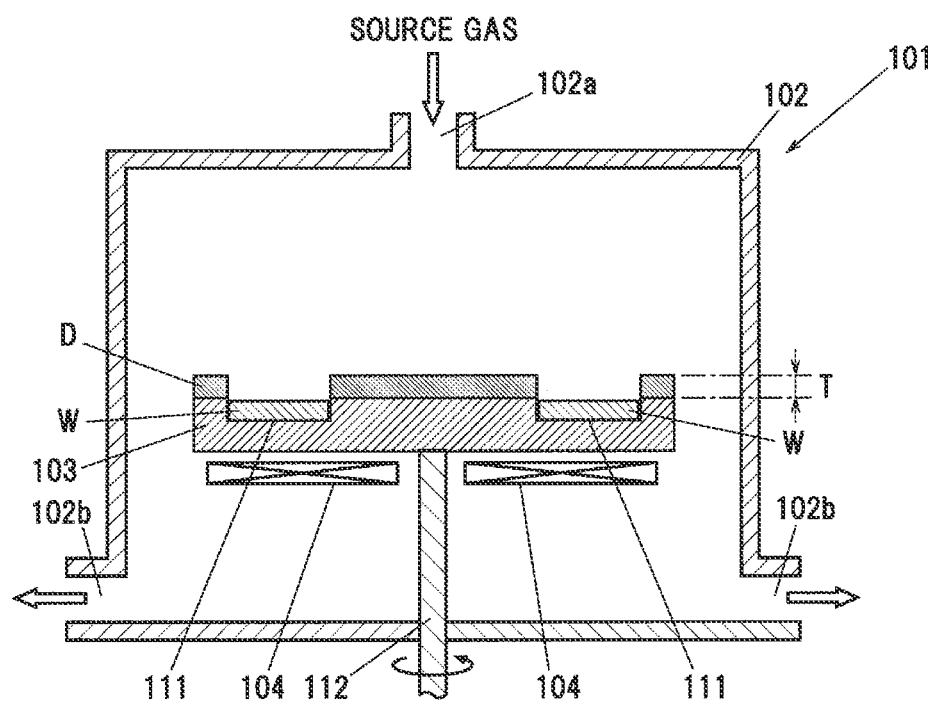
FIG. 2 is a schematic diagram illustrating an apparatus for manufacturing a nitride semiconductor light-emitting element.

As shown in FIG. 2, the manufacturing apparatus 101 includes a reactor 102 having an introduction port 102a to introduce source gases and a discharge port 102b to discharge the source gases, the susceptor 103 (a tray) which is housed in the reactor 102 and holds a wafer(s) W, a heater 104 arranged under the susceptor 103 to heat the susceptor 103, and a rotational mechanism (not shown) having a rotating shaft 112 attached to the susceptor 103. In the process of manufacturing the light-emitting element 1 using the manufacturing apparatus 101, the susceptor 103 is heated by the heater 104 while rotating the susceptor 103 by the rotating shaft 112 at a set rotational speed in the state in which the wafers W to be the substrates 10 are placed on the susceptor 103, and the temperature condition is adjusted to a set temperature. In this state, the source gases are introduced from the introduction port 102a and each layer is grown on the wafer W.

The susceptor 103 is formed in a substantially disk shape as a whole, and plural pockets 111 for housing plural wafers W are provided in a recessed manner on a surface (an upper surface) thereof. Each pocket 111 is a recess and has a circular shape in a plane view (a top view), and the plural disk-shaped wafers W to be the substrates 10 are respectively mounted on the bottom surfaces of the pockets 111 and are placed so as to be housed in the plural pockets 111. That is, the bottom surface of the pocket 111 is a mounting surface on which the substrate 10 is placed.

The reference sign D denotes a deposited material that is deposited on the surface (the upper surface) of the susceptor 103 except portions with the pockets 111. That is, the deposited material D is deposited on the susceptor 103 at the position other than the bottom surfaces of the pockets 111. The deposited material D is formed due to crystal growth and deposition of raw materials (mainly MN and AlGaN) on the surface of the susceptor 103 during each growth step of the manufacturing process. That is, the deposited material D is mainly made of AlGaN and contains silicon which is an n-type impurity and magnesium which is a p-type impurity. In addition, the crystal structure of the deposited material is a single crystal or a polycrystal, or a mixture of a single crystal and a polycrystal. In this regard, the composition ratio, etc., in the deposited material D does not need to be constant and may have a distribution.

The manufacturing apparatus 101 is configured so that the wafers W can be changed in a state in which the deposited material D is deposited on the susceptor 103. In the process of manufacturing the light-emitting element 1 using the manufacturing apparatus 101, the growth step of each layer is performed in the state in which the thickness T of the deposited material D has been adjusted to not less than 45 μm and not more than 250 μm. The value of "250 μm" is a value above which the deposited material D is likely to come off of the susceptor 103 and there is a high possibility that the deposited material D comes off during the growth step of each layer and contaminates the wafers W. The "thickness T of the deposited material D" here is a height of the deposited material D deposited on the surface of the susceptor 103, i.e., a vertical distance from the surface of the susceptor 103 to the surface (the upper surface) of the deposited material D.

(Process of Manufacturing Light-Emitting Element)

Next, a process (method) of manufacturing the light-emitting element 1 will be described in reference to FIG. 3. As shown in FIG. 3, a deposited material adjustment step S1-S3, a wafer placement step S4, a buffer layer growth step S5, an n-type cladding layer growth step S6 (an n-type semiconductor layer growth step), an active layer growth step S7-S8, an electron blocking layer growth step S9, a p-type semiconductor layer growth step S10-S11, a region removal step S12, an n-side electrode formation step S13, a p-side electrode formation step S14 and a dicing step S15 are sequentially performed in the process of manufacturing the light-emitting element 1. Growth of each layer in each growth step is performed by the Metal Organic Chemical Vapor Deposition (MOCVD) method. In addition, the Al composition ratio of each layer is controlled to have an intended value by adjusting compositions, etc., of trimethylaluminum (TMA) and trimethylgallium (TMG), etc., which constitute the source gases.

In the deposited material adjustment step S1-S3, the thickness T of the deposited material D on the susceptor 103 is adjusted to not less than 45 μm and not more than 250 μm. In particular, firstly, it is determined whether the current thickness T of the deposited material D on the susceptor 103 is not less than 45 μm and not more than 250 μm, or less than 45 μm, or more than 250 μm (S1). The current thickness T of the deposited material D on the susceptor 103 can be estimated from the number of growth steps performed before the current manufacturing process and the film thickness of the growth layer formed in each growth step. It is determined whether this estimated value is not less than 45 μm and not more than 250 μm, or less than 45 μm, or more than 250 μm. When it is determined that the thickness T of the deposited material D on the susceptor 103 is not less than 45 μm and not more than 250 μm as a result of the determination (S1:A), the process proceeds to the next step (S4) without doing anything.

Meanwhile, when it is determined that the thickness T of the deposited material D on the susceptor 103 is less than 45 μm as a result of the determination (S1:B), a pre-growth processing is performed so that the thickness T of the deposited material D on the susceptor 103 becomes 45 μm (S2). That is, dummy wafers W are placed on the susceptor 103 and a series of growth steps S5-S11 in the process of manufacturing the light-emitting element 1 is repeatedly performed until the thickness T of the deposited material D reaches 45 μm. Of the series of growth steps S5-S11, the p-type cladding layer growth step S10 (described layer) may be omitted when a thickness added to the deposited material D in the pre-growth processing is not more than 0.5 μm.

In calculation of the thickness of the deposited material D to be deposited in the pre-growth processing and calculation of the above-mentioned estimated value in the determination step (S1), it is calculated on the assumption that the thickness of the deposited material D deposited in a p-type contact layer growth step S11 is 0 (zero). This is because an amount of the deposited material D deposited in the p-type contact layer growth step S11 is decomposed by a heating process during performing the series of growth steps S5-S11. In addition, when the Al composition ratio of the p-type cladding layer 70 grown in a p-type cladding layer growth step S10 is not more than 10%, it is calculated on the assumption that the thickness T of the deposited material D deposited in the p-type cladding layer growth step S10 is 0 in these calculations for the same reason. Furthermore, in these calculations, it is calculated on the assumption that the thickness of the deposited material D deposited in the step(s) of growing the growth layer with a film thickness of not more than 0.5 μm among the series of growth steps S5-S11 is 0.

Meanwhile, when it is determined that it is more than 250 μm as a result of the determination (S1:C), the susceptor 103 is taken out of the reactor 102 and the deposited material D on the susceptor 103 is polished to adjust the thickness T of the deposited material D to 45 μm (S3). Instead of such an adjustment, after entirely removing the deposited material D on the susceptor 103, the series of growth steps S5-S11 in the manufacturing process may be repeatedly performed until the thickness T of the deposited material D reaches 45 μm in the same manner as in S2. By these steps S1-S3, the thickness T of the deposited material D on the susceptor 103 is adjusted to not less than 45 μm and not more than 250 μm.

In the wafer placement step S4, the wafers W are placed on the susceptor 103 after adjusting the thickness T of the deposited material D in the deposited material adjustment step S1-S3. That is, the wafers W are mounted on the bottom surfaces of the pockets 111, so the wafers W are housed in the plural pockets 111 of the susceptor 103.

In the buffer layer growth step S5, the buffer layer 20 is epitaxially grown by a high temperature growth at not less than 1,000° C. and not more than 1,400° C. on each wafer W (on the surface of each wafer W) placed on the susceptor 103 in the wafer placement step S4. In the buffer layer growth step S5, the buffer layer 20 is grown in the state in which the thickness T of the deposited material D on the susceptor 103 has been adjusted to not less than 45 μm and not more than 250 μm in the deposited material adjustment step S1-S3. In other words, in the buffer layer growth step S5, the buffer layer 20 is grown in the state in which the deposited material D with the thickness T of not less than 45 μm and not more than 250 μm is deposited on the susceptor 103. In addition, in the buffer layer growth step S5, the buffer layer 20 is grown so that the buffer layer 20 has a thickness of not less than 0.01 μm and not more than 2.5 μm (preferably not less than 1.4 μm and not more than 2.1 μm, more preferably not less than 1.4 μm and not more than 1.6 μm). Furthermore, in the buffer layer growth step S5, the buffer layer 20 is grown so that the buffer layer 20 has a FWHM for the (102) plane of not less than 369.4 arcsec and not more than 492.5 arcsec (preferably not less than 378.2 arcsec and not more than 492.5 arcsec, more preferably not less than 420.4 arcsec and not more than 492.5 arcsec).

In the n-type cladding layer growth step S6, the n-type cladding layer 30 is epitaxially grown under the temperature condition of not less than 1,020° C. and not more than 1,180° C. on the buffer layer 20 (on the surface of the buffer layer 20) grown in the buffer layer growth step S5. In addition, in the n-type cladding layer growth step S6, the n-type cladding layer 30 is grown so that the n-type cladding layer 30 has an Al composition ratio of not more than 50% (preferably not less than 25% and not more than 50%) and a thickness of not less than 1 μm and not more than 4 μm (preferably not less than 2.5 μm and not more than 3.5 μm, more preferably 3 μm). Furthermore, in the n-type cladding layer growth step S6, the n-type cladding layer 30 is grown so that the n-type cladding layer 30 has a FWHM for the (102) plane of not more than 662.1 arcsec (preferably not more than 528.1 arcsec).

A barrier layer growth step S7 and a well layer growth step S8 are performed in the active layer growth step. In the barrier layer growth step S7, the barrier layer 51 is epitaxially grown under the temperature condition of not less than 1,000° C. and not more than 1,100° C. on the n-type cladding layer 30 (on the surface of the n-type cladding layer 30) grown in the n-type cladding layer growth step S6. In addition, in the barrier layer growth step S7, the barrier layer 51 is grown so that the barrier layer 51 has an Al composition ratio of not more than 90% (preferably not less than 50% and not more than 80%) and a thickness of not less than 3 nm and not more than 50 nm (not less than 10 nm and not more than 20 nm).

In the well layer growth step S8, the well layer 52 is epitaxially grown under the temperature condition of not less than 1,000° C. and not more than 1,100° C. on the barrier layer 51 (on the surface of the barrier layer 51) grown by the barrier layer growth step S7. In addition, in the well layer growth step S8, the well layer 52 is grown so that the well layer 52 has an Al composition ratio of not more than 45% and a thickness of not less than 2 nm and not more than 10 nm (preferably not less than 3 nm and not more than 6 nm).

In the electron blocking layer growth step S9, the electron blocking layer 60 is epitaxially grown under the temperature condition of not less than 1,000° C. and not more than 1,100° C. on the active layer 50 (on the surface of the active layer 50) grown in the active layer growth step S7-S8.

A p-type cladding layer growth step S10 and a p-type contact layer growth step S11 are performed in the p-type semiconductor layer growth step S10-S11. In the p-type cladding layer growth step S10, the p-type cladding layer 70 is epitaxially grown under the temperature condition of not less than 1,000° C. and not more than 1,100° C. on the electron blocking layer 60 (on the surface of the electron blocking layer 60) grown in the electron blocking layer growth step S9. In addition, in the p-type cladding layer growth step S10, the p-type cladding layer 70 is grown so that the p-type cladding layer 70 has an Al composition ratio of not more than 70% (preferably in a range within ±10% of the Al composition ratio of the n-type cladding layer 30, more preferably the same as the Al composition ratio of the n-type cladding layer 30) and a thickness of not less than 10 nm and not more than 1,000 nm (preferably not less than 20 nm and not more than 150 nm).

In the p-type contact layer growth step S11, the p-type contact layer 80 is epitaxially grown under the temperature condition of not less than 900° C. and not more than 1,100° C. on the p-type cladding layer 70 (on the surface of the p-type cladding layer 70) grown in the p-type cladding layer growth step S10. In addition, in the p-type contact layer growth step S11, the p-type contact layer 80 is grown so that the p-type contact layer 80 has an Al composition ratio of not more than 10% (preferably 0%) and a thickness of not less than 5 nm and not more than 1,000 nm.

In the region removal step S12, a mask is formed on the p-type contact layer 80 grown in the p-type contact layer growth step S11, and then, the unmasked exposed region of each of the active layer 50, the electron blocking layer 60, the p-type cladding layer 70 and the p-type contact layer 80 is removed.

In the n-side electrode formation step S13, the n-side electrode 90 is formed on an exposed surface 30a of the n-type cladding layer 30 (see FIG. 1). In the p-side electrode formation step S14, the p-side electrode 92 is formed on the p-type contact layer 80 after removing the mask. The n-side electrode 90 and the p-side electrode 92 can be formed by, e.g., a well-known method such as electron beam evaporation method or sputtering method.

In the dicing step S15, the wafer W (a stacked structure in which each layer and each electrode are formed on the wafer W) is cut into pieces with a predetermined dimension.

The light-emitting element 1 shown in FIG. 1 is thereby obtained.

EXAMPLES

Next, each of Examples (First to Ninth Examples) as specific example of the above embodiment will be described. Each Example is configured according to the above-described embodiment unless otherwise specified.

In First Example, in the state in which the thickness T of the deposited material D on the susceptor 103 was adjusted to 182 μm, the buffer layer 20 was grown in the buffer layer growth step S5 so as to have a thickness of 2 μm. Then, the n-type cladding layer 30 was grown in the n-type cladding layer growth step S6 so as to have a thickness of not less than 2,900 nm and not more than 3,500 nm and an Al composition ratio of not less than 46.5% and not more than 49.5%. As a result, in the light-emitting element 1 of First Example, the FWHM for the (102) plane of the buffer layer 20 was 410.8 arcsec and the FWHM for the (102) plane of the n-type cladding layer 30 was 528.1 arcsec.

In Second Example, in the state in which the thickness T of the deposited material D on the susceptor 103 was adjusted to 53 μm, the buffer layer 20 was grown in the buffer layer growth step S5 so as to have a thickness of 2 μm. Then, the n-type cladding layer 30 was grown in the n-type cladding layer growth step S6 so as to have a thickness of not less than 2,900 nm and not more than 3,500 nm and an Al composition ratio of not less than 46.5% and not more than 49.5%. As a result, in the light-emitting element 1 of Second Example, the FWHM for the (102) plane of the buffer layer 20 was 375.2 arcsec and the FWHM for the (102) plane of the n-type cladding layer 30 was 556.7 arcsec.

In Third Example, in the state in which the thickness T of the deposited material D on the susceptor 103 was adjusted to 66 μm, the buffer layer 20 was grown in the buffer layer growth step S5 so as to have a thickness of 2 μm. Then, the n-type cladding layer 30 was grown in the n-type cladding layer growth step S6 so as to have a thickness of not less than 2,900 nm and not more than 3,500 nm and an Al composition ratio of not less than 46.5% and not more than 49.5%. As a result, in the light-emitting element 1 of Third Example, the FWHM for the (102) plane of the buffer layer 20 was 378.2 arcsec and the FWHM for the (102) plane of the n-type cladding layer 30 was 605.4 arcsec.

In Fourth Example, in the state in which the thickness T of the deposited material D on the susceptor 103 was adjusted to 80 μm, the buffer layer 20 was grown in the buffer layer growth step S5 so as to have a thickness of 2 μm. Then, the n-type cladding layer 30 was grown in the n-type cladding layer growth step S6 so as to have a thickness of not less than 2,900 nm and not more than 3,500 nm and an Al composition ratio of not less than 46.5% and not more than 49.5%. As a result, in the light-emitting element 1 of Fourth Example, the FWHM for the (102) plane of the buffer layer 20 was 369.4 arcsec and the FWHM for the (102) plane of the n-type cladding layer 30 was 662.1 arcsec.

In Fifth Example, in the state in which the thickness T of the deposited material D on the susceptor 103 was adjusted to 186 μm, the buffer layer 20 was grown in the buffer layer growth step S5 so as to have a thickness of 2 μm. Then, the n-type cladding layer 30 was grown in the n-type cladding layer growth step S6 so as to have a thickness of not less than 2,900 nm and not more than 3,500 nm and an Al composition ratio of not less than 46.5% and not more than 49.5%. As a result, in the light-emitting element 1 of Fifth Example, the FWHM for the (102) plane of the buffer layer 20 was 420.4 arcsec and the FWHM for the (102) plane of the n-type cladding layer 30 was 501.9 arcsec.

In Sixth Example, in the state in which the thickness T of the deposited material D on the susceptor 103 was adjusted to 194 μm, the buffer layer 20 was grown in the buffer layer growth step S5 so as to have a thickness of 2 μm. Then, the n-type cladding layer 30 was grown in the n-type cladding layer growth step S6 so as to have a thickness of not less than 2,900 nm and not more than 3,500 nm and an Al composition ratio of not less than 46.5% and not more than 49.5%. As a result, in the light-emitting element 1 of Sixth Example, the FWHM for the (102) plane of the buffer layer 20 was 430 arcsec and the FWHM for the (102) plane of the n-type cladding layer 30 was 487.2 arcsec.

In Seventh Example, in the state in which the thickness T of the deposited material D on the susceptor 103 was adjusted to 100 μm, the buffer layer 20 was grown in the buffer layer growth step S5 so as to have a thickness of 1.5 μm. Then, the n-type cladding layer 30 was grown in the n-type cladding layer growth step S6 so as to have a thickness of not less than 2,900 nm and not more than 3,500 nm and an Al composition ratio of not less than 46.5% and not more than 49.5%. As a result, in the light-emitting element 1 of Seventh Example, the FWHM for the (102) plane of the buffer layer 20 was 463.5 arcsec and the FWHM for the (102) plane of the n-type cladding layer 30 was 481.1 arcsec.

In Eighth Example, in the state in which the thickness T of the deposited material D on the susceptor 103 was adjusted to 116 μm, the buffer layer 20 was grown in the buffer layer growth step S5 so as to have a thickness of 1.5 μm. Then, the n-type cladding layer 30 was grown in the n-type cladding layer growth step S6 so as to have a thickness of not less than 2,900 nm and not more than 3,500 nm and an Al composition ratio of not less than 46.5% and not more than 49.5%. As a result, in the light-emitting element 1 of Eighth Example, the FWHM for the (102) plane of the buffer layer 20 was 486 arcsec and the FWHM for the (102) plane of the n-type cladding layer 30 was 491.4 arcsec.

In Ninth Example, in the state in which the thickness T of the deposited material D on the susceptor 103 was adjusted to 124 μm, the buffer layer 20 was grown in the buffer layer growth step S5 so as to have a thickness of 1.5 μm. Then, the n-type cladding layer 30 was grown in the n-type cladding layer growth step S6 so as to have a thickness of not less than 2,900 nm and not more than 3,500 nm and an Al composition ratio of not less than 46.5% and not more than 49.5%. As a result, in the light-emitting element 1 of Ninth Example, the FWHM for the (102) plane of the buffer layer 20 was 492.5 arcsec and the FWHM for the (102) plane of the n-type cladding layer 30 was 503.7 arcsec.

(Measurement Results)

When light output was measured in each of Examples described above as well as Comparative Examples (First Comparative Example and Second Comparative Example), the results shown in the table of FIG. 4 were obtained. In addition, the graphs shown in FIGS. 5 to 9 were obtained from the table of FIG. 4. Emission wavelength in FIG. 4 is a wavelength at which light output was measured. Light output can be measured by various known methods, and in these Examples, In electrodes were respectively attached to the center portion and edge portion of the wafer W, a current was passed and light output was measured by a photodetector, as an example.

Meanwhile, in First Comparative Example, in the state in which the thickness T of the deposited material D on the susceptor 103 was adjusted to 16 μm, the buffer layer 20 was grown in the buffer layer growth step S5 so as to have a thickness of 2 μm. Then, the n-type cladding layer 30 was grown in the n-type cladding layer growth step S6 so as to have a thickness of not less than 2,900 nm and not more than 3,500 nm and an Al composition ratio of not less than 46.5% and not more than 49.5%. As a result, in the light-emitting element 1 of First Comparative Example, the FWHM for the (102) plane of the buffer layer 20 was 354.5 arcsec and the FWHM for the (102) plane of the n-type cladding layer 30 was 758.9 arcsec.

In Second Comparative Example, in the state in which the thickness T of the deposited material D on the susceptor 103 was adjusted to 8 μm, the buffer layer 20 was grown in the buffer layer growth step S5 so as to have a thickness of 2 μm. Then, the n-type cladding layer 30 was grown in the n-type cladding layer growth step S6 so as to have a thickness of not less than 2,900 nm and not more than 3,500 nm and an Al composition ratio of not less than 46.5% and not more than 49.5%. As a result, in the light-emitting element 1 of Second Comparative Example, the FWHM for the (102) plane of the buffer layer 20 was 356.1 arcsec and the FWHM for the (102) plane of the n-type cladding layer 30 was 782.8 arcsec. First Comparative Example and Second Comparative Example are configured according to the above-described embodiment and have the same configuration as that in the above-described Examples, unless otherwise specified.

Figure 5:
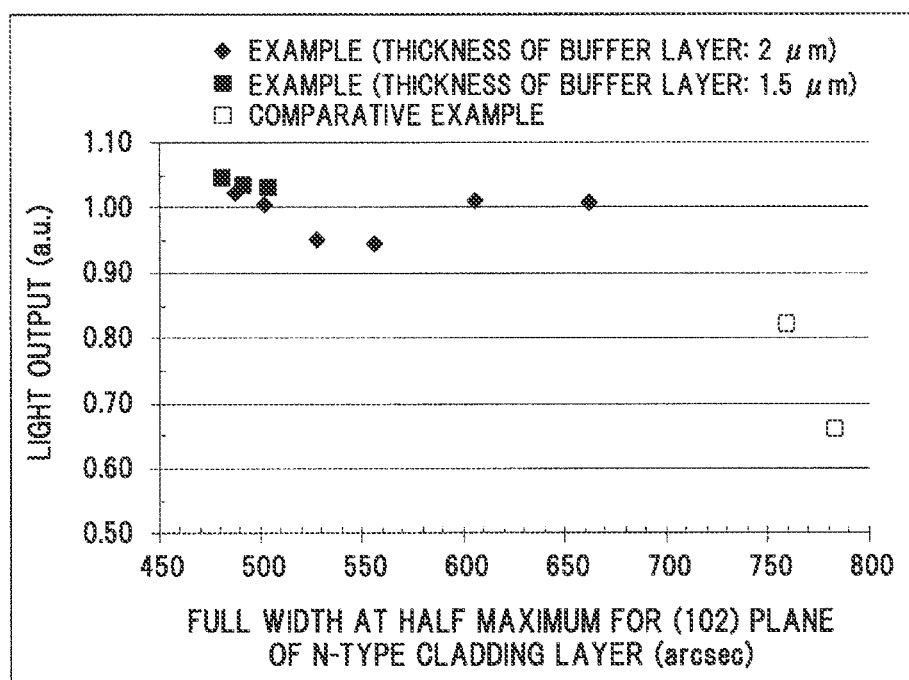
FIG. 5 is a graph showing a relation between a full width at half maximum for a (102) plane of an n-type cladding layer and light output in Examples and Comparative Examples.

FIG. 5 is a graph showing a relation between the FWHM for the (102) plane of the n-type cladding layer 30 and light output in Examples and Comparative Examples. As shown in FIG. 5, when the FWHM for the (102) plane of the n-type cladding layer 30 is not more than 662.1 arcsec, light output is not less than 0.9 [a.u.]. When the FWHM for the (102) plane of the n-type cladding layer 30 is not more than 528.1 arcsec, light output is not less than 0.95 [a.u.]. That is, it is possible to obtain high light output by setting the FWHM for the (102) plane of the n-type cladding layer 30 to not more than 662.1 arcsec, and it is possible to obtain higher light output by setting the FWHM for the (102) plane of the n-type cladding layer 30 to not more than 528.1 arcsec. It is presumed that the reason why light output is improved is that when the FWHM for the (102) plane of the n-type cladding layer 30 is within the above-mentioned predetermined range, crystal quality of the active layer 50 is improved since stress applied to the active layer 50 is at an optimum level, and also, non-luminescent recombination due to dislocations is suppressed since the number of dislocations in the active layer 50 is small.

Figure 6:
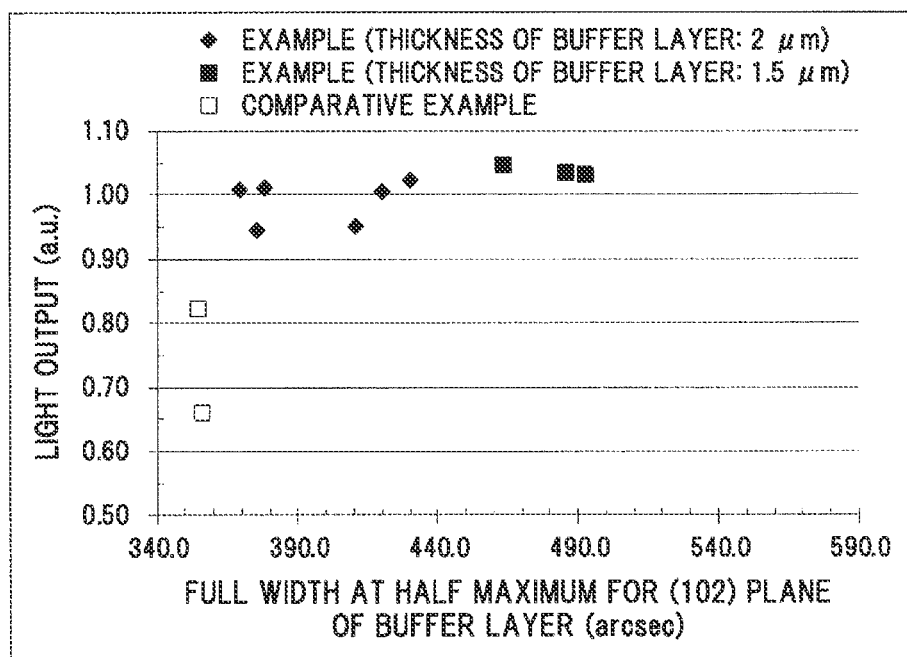
FIG. 6 is a graph showing a relation between a full width at half maximum for a (102) plane of a buffer layer and light output in Examples and Comparative Examples.

FIG. 6 is a graph showing a relation between the FWHM for the (102) plane of the buffer layer 20 and light output in Examples and Comparative Examples. As shown in FIG. 6, when the FWHM for the (102) plane of the buffer layer 20 is not less than 369.4 arcsec and not more than 492.5 arcsec, light output is not less than 0.9 [a.u.]. When the FWHM for the (102) plane of the buffer layer 20 is not less than 378.2 arcsec and not more than 492.5 arcsec, light output is not less than 0.95 [a.u.]. Furthermore, when the FWHM for the (102) plane of the buffer layer 20 is not less than 420.4 arcsec and not more than 492.5 arcsec, light output is not less than 1 [a.u.]. That is, it is possible to obtain high light output by setting the FWHM for the (102) plane of the buffer layer 20 to not less than 369.4 arcsec and not more than 492.5 arcsec, and it is possible to obtain higher light output by setting the FWHM for the (102) plane of the buffer layer 20 to not less than 378.2 arcsec and not more than 492.5 arcsec. It is possible to obtain further higher light output by setting the FWHM for the (102) plane of the buffer layer 20 to not less than 420.4 arcsec and not more than 492.5 arcsec.

Figure 7:
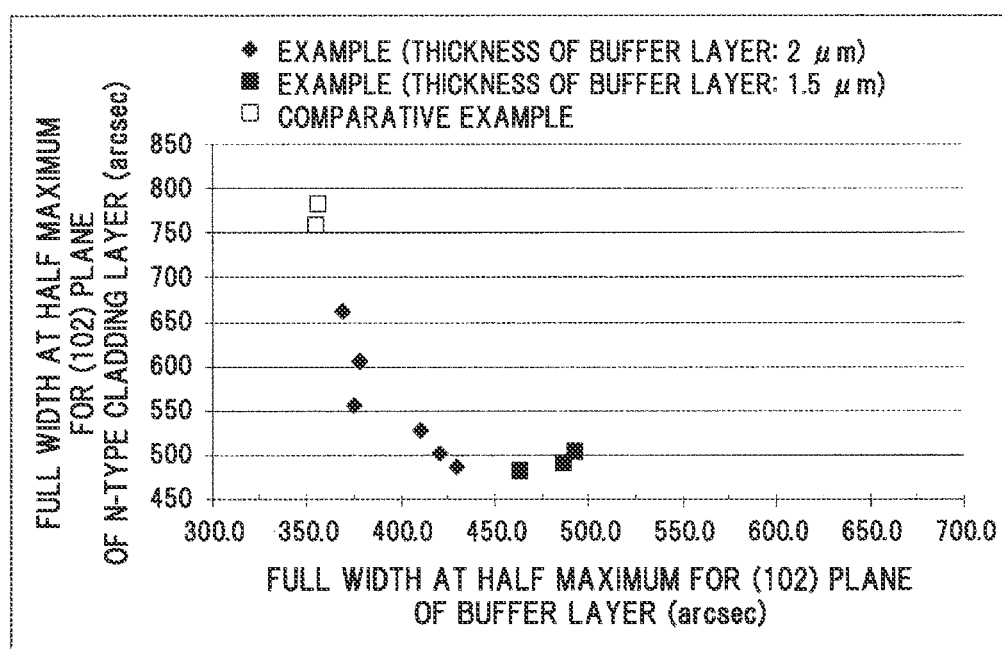
FIG. 7 is a graph showing a relation between the full width at half maximum for the (102) plane of the buffer layer and the full width at half maximum for the (102) plane of the n-type cladding layer in Examples and Comparative Examples.

FIG. 7 is a graph showing a relation between the FWHM for the (102) plane of the buffer layer 20 and the FWHM for the (102) plane of the n-type cladding layer 30 in Examples and Comparative Examples. As shown in FIG. 7, when the FWHM for the (102) plane of the buffer layer 20 is not less than 369.4 arcsec and not more than 492.5 arcsec, the FWHM for the (102) plane of the n-type cladding layer 30 is (or is likely to be) not more than 662.1 arcsec.

Considering FIGS. 5 to 7, it is presumed that the reason why high light output is obtained when the FWHM for the (102) plane of the buffer layer 20 is in the above-mentioned predetermined range is that the FWHM for the (102) plane of the n-type cladding layer 30 falls within the above-mentioned predetermined range when the FWHM for the (102) plane of the buffer layer 20 is within the above-mentioned predetermined range, and as a result, light output is improved.

Figure 8:
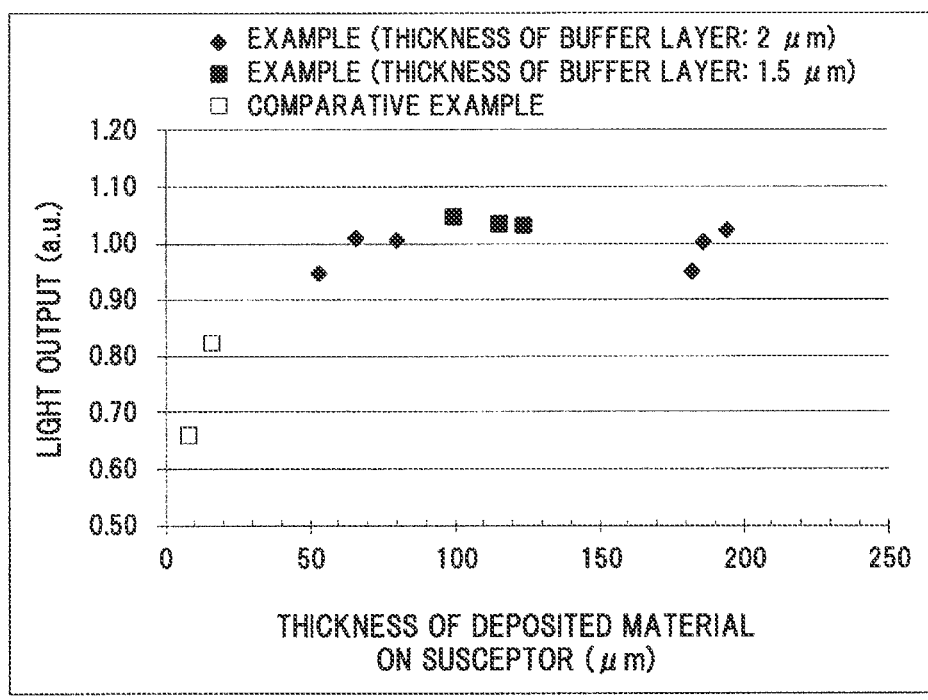
FIG. 8 is a graph showing a relation between a thickness of a deposited material on a susceptor and light output in Examples and Comparative Examples.

FIG. 8 is a graph showing a relation between the thickness T of the deposited material D on the susceptor 103 and light output. As shown in FIG. 8, when the thickness T of the deposited material D on the susceptor 103 in the buffer layer growth step S5 is not less than 45 μm and not more than 250 μm, light output is not less than 0.9 [a.u.]. When the thickness T of the deposited material D on the susceptor 103 is not less than 66 μm and not more than 250 μm, light output is not less than 0.95 [a.u.]. Furthermore, when the thickness T of the deposited material D on the susceptor 103 is not less than 45 μm and not more than 250 μm and the thickness of the buffer layer 20 is not less than 1.4 μm and not more than 1.6 μm, light output is not less than 1 [a.u.]. That is, it is possible to obtain high light output by setting the thickness T of the deposited material D on the susceptor 103 to not less than 45 μm and not more than 250 μm, and it is possible to obtain higher light output by setting the thickness T of the deposited material D on the susceptor 103 to not less than 66 μm and not more than 250 μm. It is possible to obtain further higher light output by setting the thickness T of the deposited material D on the susceptor 103 to not less than 45 μm and not more than 250 μm and the thickness of the buffer layer 20 to not less than 1.4 μm and not more than 1.6

Figure 9:
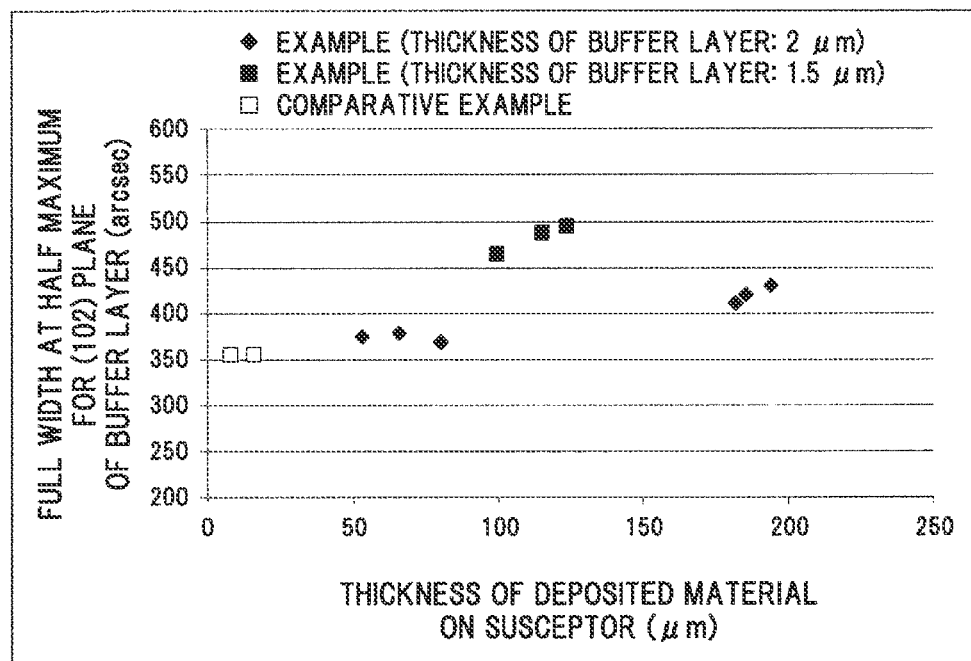
FIG. 9 is a graph showing a relation between the thickness of the deposited material on the susceptor and the full width at half maximum for the (102) plane of the buffer layer in Examples and Comparative Examples.

FIG. 9 is a graph showing a relation between the thickness T of the deposited material D on the susceptor 103 and the FWHM for the (102) plane of the buffer layer 20. As shown in FIG. 9, when thickness T of the deposited material D on the susceptor 103 in the buffer layer growth step S5 is not less than 45 μm and not more than 250 μm, the FWHM for the (102) plane of the buffer layer 20 is (or is likely to be) not less than 369.4 arcsec and not more than 492.5 arcsec. When thickness T of the deposited material D on the susceptor 103 is not less than 45 μm and not more than 250 μm and the thickness of the buffer layer 20 is not less than 1.4 μm and not more than 1.6 μm, the FWHM for the (102) plane of the buffer layer 20 is (or is likely to be) not less than 420.4 arcsec and not more than 492.5 arcsec. It is presumed that the reason why the FWHM for the (102) plane of the buffer layer 20 is within the above-mentioned predetermined range when the thickness T of the deposited material D on the susceptor 103 is within the above-mentioned predetermined range is that contamination of inner atmosphere, etc., occurs due to the deposited material D in the buffer layer growth step S5 and crystal quality of the buffer layer 20 degrades.

Considering FIGS. 5 to 9, it is presumed that the reason why high light output is obtained when the thickness T of the deposited material D on the susceptor 103 is within the above-mentioned predetermined range is that the FWHM for the (102) plane of the buffer layer 20 falls within the above-mentioned predetermined range when the thickness T of the deposited material D on the susceptor 103 is within the above-mentioned predetermined range, the FWHM for the (102) plane of the n-type cladding layer 30 thus falls within the above-mentioned predetermined range, and light output is thereby improved.

(Functions and Effects of the Embodiment)

In the embodiment described above, by setting the FWHM for the (102) plane of the buffer layer 20 to not less than 369.4 arcsec and not more than 492.5 arcsec in the light-emitting element 1 which uses the single quantum well structure 50A, high light output of the light-emitting element 1 is obtained and luminous efficiency is improved. In addition, by setting the FWHM for the (102) plane of the n-type cladding layer 30 to not more than 662.1 arcsec in the light-emitting element 1 which uses the single quantum well structure 50A, high light output is obtained and luminous efficiency is improve. The present invention was conceived based on the finding that the crystal quality of the buffer layer 20 affects the crystal quality of the n-type cladding layer 30 and the crystal quality of the n-type cladding layer 30 affects light output of the light-emitting element 1.

(Modification)

Figure 10:
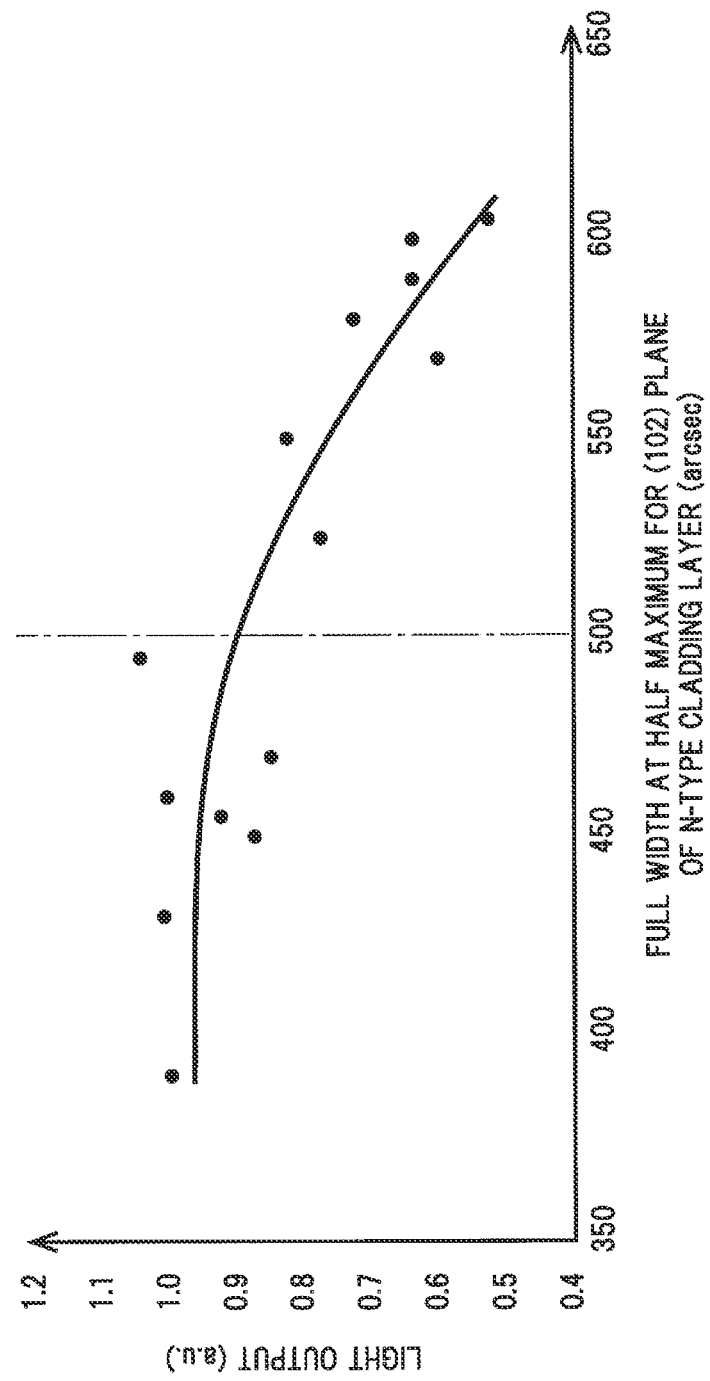
FIG. 10 is a graph showing a relation between the full width at half maximum for the (102) plane of the n-type cladding layer and light output of multiple quantum well nitride semiconductor light-emitting elements.

Although the FWHM for the (102) plane of the n-type cladding layer 30 is not more than 662.1 arcsec (preferably, not more than 528.1 arcsec) in the embodiment, the FWHM for the (102) plane of the n-type cladding layer 30 may be not less than 500 arcsec and not more than 662.1 arcsec (preferably, not less than 500 arcsec and not more than 528.1 arcsec). That is, the single quantum well structure 50A may be used as the quantum well structure of the active layer 50 in the light-emitting element 1 that has the FWHM for the (102) plane of the n-type cladding layer 30 of not less than 500 arcsec and not more than 662.1 arcsec (preferably, not less than 500 arcsec and not more than 528.1 arcsec). With this configuration, it is possible to obtain high light output even when the FWHM for the (102) plane of the n-type cladding layer 30 is not less than 500 arcsec. FIG. 10 is a graph showing a relation between the FWHM for the (102) plane of the n-type cladding layer 30 and light output based on results of measuring light output of plural multiple quantum well light-emitting elements that have different FWHMs for the (102) plane of the n-type cladding layer 30. In case of multiple quantum well light-emitting elements which are generally used because high light output is obtained, light output decreases when the FWHM for the (102) plane of the n-type cladding layer 30 is not less than 500 arcsec as shown in FIG. 10. However, in case of the light-emitting element 1, it is possible obtain high light output and improve luminous efficiency of the light-emitting element 1 by using the single quantum well structure even when the FWHM for the (102) plane of the n-type cladding layer 30 is not less than 500 arcsec as shown in FIG. 5. We found that light output of generally used multiple quantum well light-emitting elements decreases when the FWHM for the (102) plane of the n-type cladding layer 30 is not less than 500 arcsec but light output of the single quantum well light-emitting element 1 does not decrease even when the FWHM for the (102) plane of the n-type cladding layer 30 is not less than 500 arcsec as shown in FIG. 5, and this finding was adopted in the present invention.

SUMMARY OF THE EMBODIMENT

Technical ideas understood from the embodiment will be described below citing the reference numerals, etc., used for the embodiment. However, each reference numeral, etc., described below is not intended to limit the constituent elements in the claims to the members, etc., specifically described in the embodiment.

[1] A nitride semiconductor light-emitting element (1) comprising: a substrate (10); a buffer layer (20) formed on the substrate (10); an n-type semiconductor layer (30) formed on the buffer layer (20); and an active layer (50) being formed on the n-type semiconductor layer (30) and comprising a single quantum well structure (50A), wherein a full width at half maximum of an X-ray rocking curve for a (102) plane of the buffer layer (20) is not less than 369.4 arcsec and not more than 492.5 arcsec.

[2] The nitride semiconductor light-emitting element (1) described in [1], wherein the full width at half maximum of the X-ray rocking curve for the (102) plane of the buffer layer (20) is not less than 378.2 arcsec and not more than 492.5 arcsec.

[3] The nitride semiconductor light-emitting element (1) described in [2], wherein the full width at half maximum of the X-ray rocking curve for the (102) plane of the buffer layer (20) is not less than 420.4 arcsec and not more than 492.5 arcsec.

[4] The nitride semiconductor light-emitting element (1) described in any one of [1] to [3], wherein a full width at half maximum of the X-ray rocking curve for the (102) plane of the n-type semiconductor layer is not more than 662.1 arcsec.

[5] A method for manufacturing a nitride semiconductor light-emitting element (1), comprising: a buffer layer growth step (S5) to grow a buffer layer (20) on a substrate (10); an n-type semiconductor layer growth step (S6) to grow an n-type semiconductor layer (30) on the buffer layer; and an active layer growth step (S7-S8) to grow active layer (50) comprising a single quantum well structure (50A) on the n-type semiconductor layer (30), wherein in the buffer layer growth step (S5), the buffer layer (20) is grown so that a full width at half maximum of an X-ray rocking curve for a (102) plane of the buffer layer (20) is not less than 369.4 arcsec and not more than 492.5 arcsec.

REFERENCE SIGNS LIST

1 Nitride semiconductor light-emitting element
10 Substrate
20 Buffer layer
30 N-type cladding layer
50 Active layer
50A Single quantum well structure
S5 Buffer layer growth step
S6 N-type cladding layer growth step
S7-S8 Active layer growth step

What is claimed is:

1. A nitride semiconductor light-emitting element, comprising:
   a substrate;
   a buffer layer formed on the substrate, the buffer layer comprising aluminum nitride;
   an n-type semiconductor layer formed on the buffer layer; and
   an active layer formed on the n-type semiconductor layer, the active layer comprising a barrier layer formed between the n-type semiconductor layer and a single quantum well layer formed on the barrier layer, the barrier layer containing an n-type impurity,
   wherein a full width at half maximum of an X-ray rocking curve for a (102) plane of the buffer layer is not less than 369.4 arcsec and not more than 492.5 arcsec,
   wherein a full width at half maximum of the X-ray rocking curve for the (102) plane of the n-type semiconductor layer is not more than 662.1 arcsec,
   wherein the active layer emitting ultraviolet light at a central wavelength of 290 nm to 365 nm,
   wherein the X-ray rocking curve for the (102) plane of the n-type semiconductor layer is not less than 500 arcsec, and
   wherein the n-type semiconductor layer is made of n-AlGaN.

2. The nitride semiconductor light-emitting element according to claim 1, wherein the full width at half maximum of the X-ray rocking curve for the (102) plane of the buffer layer is not less than 378.2 arcsec and not more than 492.5 arcsec.

3. The nitride semiconductor light-emitting element according to claim 2, wherein the full width at half maximum of the X-ray rocking curve for the (102) plane of the buffer layer is not less than 420.4 arcsec and not more than 492.5 arcsec.

4. The nitride semiconductor light-emitting element according to claim 1, wherein a full width at half maximum of the X-ray rocking curve for the (102) plane of the n-type semiconductor layer is not more than 528.1 arcsec.

5. The nitride semiconductor light-emitting element according to claim 1, wherein the Al composition ratio of $Al_sGa_{1-s}N$ layer constituting the single quantum well layer is not more than 45% (0<s<0.45).

6. The nitride semiconductor light-emitting element according to claim 4, wherein a full width at half maximum of the X-ray rocking curve for the (102) plane of the n-type semiconductor layer is not less than 369.4 arcsec and not more than 492.5 arcsec.

* * * * *